(12) United States Patent
Zhang et al.

(10) Patent No.: US 9,601,605 B2
(45) Date of Patent: Mar. 21, 2017

(54) BIPOLAR JUNCTION TRANSISTOR WITH IMPROVED AVALANCHE CAPABILITY

(75) Inventors: Qingchun Zhang, Cary, NC (US); Anant K. Agarwal, Chapel Hill, NC (US); Lin Cheng, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 549 days.

(21) Appl. No.: 13/438,902

(22) Filed: Apr. 4, 2012

(65) Prior Publication Data

US 2013/0264581 A1    Oct. 10, 2013

(51) Int. Cl.
| | | |
|---|---|---|
| H01L 29/73 | (2006.01) | |
| H01L 29/06 | (2006.01) | |
| H01L 29/74 | (2006.01) | |
| H01L 29/16 | (2006.01) | |

(52) U.S. Cl.
CPC ...... *H01L 29/7302* (2013.01); *H01L 29/0626* (2013.01); *H01L 29/1608* (2013.01); *H01L 29/7424* (2013.01)

(58) Field of Classification Search
CPC . H01L 29/70; H01L 21/8249; H01L 27/0229; H01L 29/739; H01L 27/06; H01L 27/0823
USPC .......... 438/170, 309, 189; 257/77, 197, 378, 257/E27.015, E27.03, E27.074, 47, 205, 257/361, 577, 517
See application file for complete search history.

(56) References Cited

U.S. PATENT DOCUMENTS

| | | | |
|---|---|---|---|
| 3,421,025 A | | 1/1969 | Mitchell et al. |
| 8,105,911 B2 * | | 1/2012 | Veliadis .............. H01L 29/0619 257/496 |
| 2003/0160302 A1 | | 8/2003 | Sankin et al. |
| 2010/0264427 A1 | | 10/2010 | Veliadis |

OTHER PUBLICATIONS

Lee, Hyung-Seok et al., "1200-V 5.2-mΩ-cm2 4H-SiC BJTs With a High Common-Emitter Current Gain," IEEE Electron Device Letters, vol. 28, Issue 11, Nov. 2007, IEEE, pp. 1007-1009.

(Continued)

*Primary Examiner* — Jarrett Stark
*Assistant Examiner* — Shahed Ahmed
(74) *Attorney, Agent, or Firm* — Anthony J. Josephson

(57) ABSTRACT

A bipolar junction transistor (BJT), which includes a collector layer, a base layer on the collector layer, an emitter layer on the base layer, and a recess region embedded in the collector layer, is disclosed. A base-collector plane is between the base layer and the collector layer. The recess region is may be below the base-collector plane. Further, the recess region and the base layer are a first type of semiconductor material. By embedding the recess region in the collector layer, the recess region and the collector layer form a first P-N junction, which may provide a point of avalanche for the BJT. Further, the collector layer and the base layer form a second P-N junction. By separating the point of avalanche from the second P-N junction, the BJT may avalanche robustly, thereby reducing the likelihood of avalanche induced failures, particularly in silicon carbide (SiC) BJTs.

32 Claims, 5 Drawing Sheets

(56) References Cited

OTHER PUBLICATIONS

Zhang, Qian et al., "Design and Optimization of Junction Termination Technology for 4H-SiC BJTs," IEEE International Conference of Electron Devices and Solid-State Circuits, Dec. 25-27, 2009, IEEE, pp. 498-500.
International Search Report and Written Opinion for PCT/US2013/034955, mailed Jun. 5, 2013, 15 pages.
International Preliminary Report on Patentability for PCT/US2013/034955, mailed Oct. 16, 2014, 10 pages.

* cited by examiner

BIPOLAR JUNCTION TRANSISTOR WITH IMPROVED AVALANCHE CAPABILITY

FIELD OF THE DISCLOSURE

The present disclosure relates to bipolar junction transistors.

BACKGROUND

Bipolar junction transistor (BJT)s may be used as power devices in certain applications. A BJT may include a collector, a base over the collector, and an emitter over the base. In operation, a transition region may form in the collector and the base. The ability of a BJT to operate into avalanche may be useful to allow for overstress in certain circuit applications. Avalanche in a BJT occurs when carriers in the transition region are accelerated by electric fields in the transition region to energies sufficient to free electron-hole pairs via collisions with bound electrons, thereby increasing the current through the transition region. Silicon carbide (SiC) BJTs may be desirable as power BJTs due to the high operating temperature range of SiC. However, certain BJTs, such as SiC BJTs, may have high surface electric fields and localized avalanche regions in the transition region, thereby resulting in extremely high localized current densities, which could lead to device failure.

SUMMARY

The present disclosure relates to a bipolar junction transistor (BJT), which includes a collector layer, a base layer on the collector layer, an emitter layer on the base layer, and a recess region embedded in the collector layer. A base-collector plane is between the base layer and the collector layer. The recess region may be below the base-collector plane. Further, the recess region and the base layer are a first type of semiconductor material.

By embedding the recess region in the collector layer, the recess region and the collector layer form a first P-N junction, which may provide a point of avalanche for the BJT. Further, the collector layer and the base layer form a second P-N junction. By separating the point of avalanche from the second P-N junction, the BJT may avalanche robustly, thereby reducing the likelihood of avalanche induced failures, particularly in silicon carbide (SiC) BJTs.

Further, by embedding the recess region in the collector layer, an output capacitance of the BJT may be reduced, particularly when the recess region is electrically coupled to an emitter of the BJT, which may reduce switching losses of the BJT. In one embodiment of the BJT, the recess region is at least partially embedded in the collector layer and a base is at least partially embedded in the collector layer, such that a physical isolation region in the collector layer physically isolates the recess region from the base.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
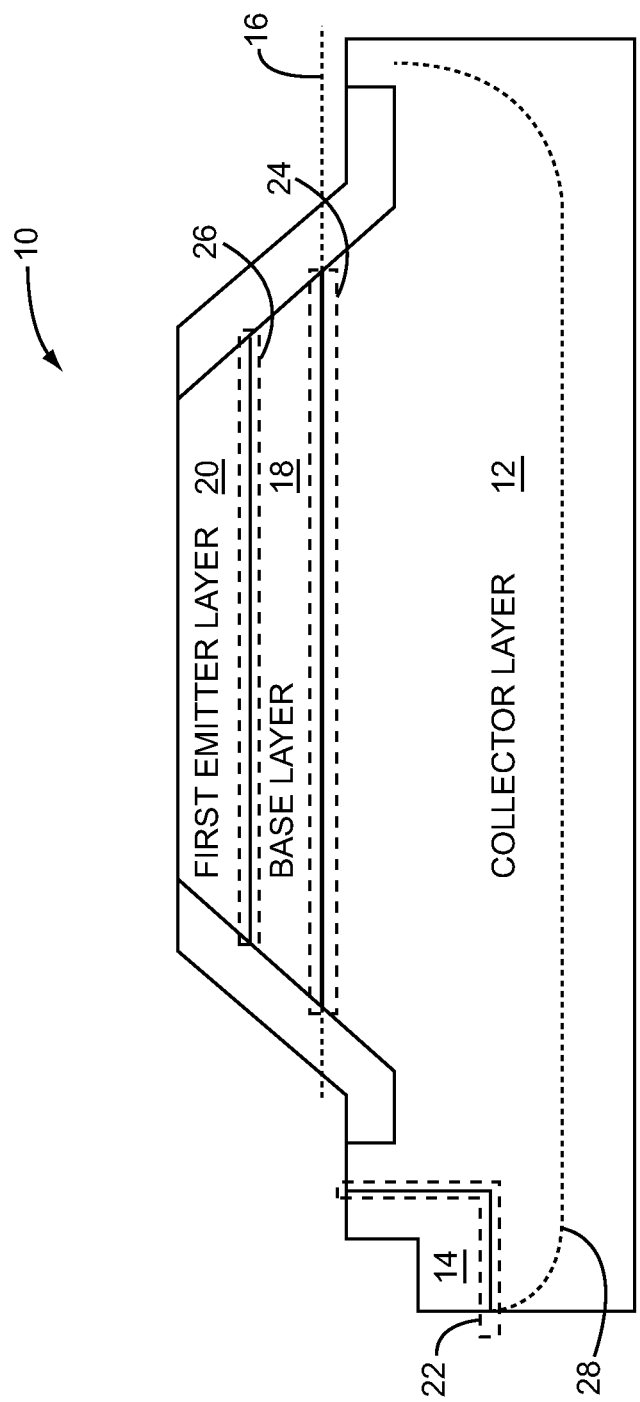
FIG. 1 illustrates a cross section of a bipolar junction transistor (BJT) according to one embodiment of the present disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

There is a need for a bipolar junction transistor (BJT), which can operate into avalanche without incurring permanent damage. As such, the present disclosure relates to a BJT, which includes a collector layer, a base layer on the collector layer, an emitter layer on the base layer, and a recess region embedded in the collector layer. A base-collector plane is between the base layer and the collector layer. The recess region may be below the base-collector plane. Further, the recess region and the base layer are a first type of semiconductor material.

By embedding the recess region in the collector layer, the recess region and the collector layer form a first P-N junction, which may provide a point of avalanche for the BJT. Further, the collector layer and the base layer form a second P-N junction. By separating the point of avalanche from the second P-N junction, the BJT may avalanche robustly, thereby reducing the likelihood of avalanche induced failures, particularly in silicon carbide (SiC) BJTs.

Further, by embedding the recess region in the collector layer, an output capacitance of the BJT may be reduced, particularly when the recess region is electrically coupled to an emitter of the BJT, which may reduce switching losses of the BJT. In one embodiment of the BJT, the recess region is at least partially embedded in the collector layer and a base is at least partially embedded in the collector layer, such that a physical isolation region in the collector layer physically isolates the recess region from the base.

FIG. 1 illustrates a cross section of a BJT 10 according to one embodiment of the present disclosure. The BJT 10 includes a collector layer 12, a recess region 14 embedded in the collector layer 12, a base-collector plane 16, a base layer 18 on the collector layer 12, and a first emitter layer 20 on the base layer 18. The base-collector plane 16 is between the base layer 18 and the collector layer 12. The recess region 14 is below the base-collector plane 16. The recess region 14 and the base layer 18 are a first type of semiconductor material. The collector layer 12 and the first emitter layer 20 are a second type of semiconductor material. By embedding the recess region 14 in the collector layer 12, the recess region 14 and the collector layer 12 form a first P-N junction 22, which may provide a point of avalanche for the BJT 10. The collector layer 12 and the base layer 18 form a second P-N junction 24. By separating the point of avalanche from the second P-N junction 24, the BJT 10 may avalanche robustly, thereby reducing the likelihood of avalanche induced failures.

In this regard, the BJT 10 may improve avalanche behavior, such that during an avalanche event of the BJT 10, at least a portion of the avalanche occurs in proximity to the first P-N junction 22 instead of in proximity to the second P-N junction 24. If at least one of the collector layer 12, the recess region 14, and the base layer 18 includes SiC, the BJT 10 is an SiC BJT.

The base layer 18 and the first emitter layer 20 form a third P-N junction 26. In one embodiment of the BJT 10, the first P-N junction 22 is deeper in the BJT 10 than the second P-N junction 24 and the third P-N junction 26. As such, the highest electric fields of the BJT 10 form a high field region, which may become the point of avalanche for the BJT 10 during avalanche events. In one embodiment of the BJT 10, the collector layer 12 and the recess region 14 provide a body 28 of the BJT 10. As such, the first P-N junction 22 provides a body diode of the body 28.

In one embodiment of the recess region 14 and the base layer 18, the first type of semiconductor material is P-type semiconductor material. In one embodiment of the collector layer 12 and the first emitter layer 20, the second type of semiconductor material is N-type semiconductor material. In an alternate embodiment of the recess region 14 and the base layer 18, the first type of semiconductor material is N-type semiconductor material. In an alternate embodiment of the collector layer 12 and the first emitter layer 20, the second type of semiconductor material is P-type semiconductor material.

In one embodiment of the collector layer 12, the collector layer 12 includes SiC. In an alternate embodiment of the collector layer 12, the collector layer 12 includes silicon (Si), gallium nitride (GaN), gallium arsenide (GaAs), diamond, the like, or any combination thereof. In one embodiment of the collector layer 12, a thickness of the collector layer 12 is between about 2 micrometers and about 100 micrometers. In one embodiment of the collector layer 12, the collector layer 12 includes N-type semiconductor material. In an additional embodiment of the collector layer 12, the collector layer 12 includes P-type semiconductor material. In one embodiment of the collector layer 12, the collector layer 12 includes lightly-doped semiconductor material. In one embodiment of the lightly-doped semiconductor material of the collector layer 12, a carrier concentration of the lightly-doped semiconductor material is between about $1\times10^{14}$ carriers per cubic centimeter and about $1\times10^{15}$ carriers per cubic centimeter. In an alternate embodiment of the collector layer 12, the collector layer 12 includes moderately-doped semiconductor material. In one embodiment of the moderately-doped semiconductor material of the collector layer 12, a carrier concentration of the moderately-doped semiconductor material is between about $1\times10^{15}$ carriers per cubic centimeter and about $1\times10^{16}$ carriers per cubic centimeter. In an additional embodiment of the collector layer 12, the collector layer 12 includes heavily-doped semiconductor material. In one embodiment of the heavily-doped semiconductor material of the collector layer 12, a carrier concentration of the heavily-doped semiconductor material is between about $1\times10^{16}$ carriers per cubic centimeter and about $1\times10^{18}$ carriers per cubic centimeter.

In one embodiment of the recess region 14, the recess region 14 includes SiC. In an alternate embodiment of the recess region 14, the recess region 14 includes Si, GaN, GaAs, diamond, the like, or any combination thereof. In one embodiment of the recess region 14, the recess region 14 includes N-type semiconductor material. In an additional embodiment of the recess region 14, the recess region 14 includes P-type semiconductor material. In one embodiment of the recess region 14, the recess region 14 includes doped semiconductor material. In one embodiment of the doped semiconductor material of the recess region 14, a carrier concentration of the doped semiconductor material is between about $1\times10^{17}$ carriers per cubic centimeter and about $1\times10^{20}$ carriers per cubic centimeter.

In one embodiment of the base layer 18, the base layer 18 includes SiC. In an alternate embodiment of the base layer 18, the base layer 18 includes Si, GaN, GaAs, diamond, the like, or any combination thereof. In one embodiment of the base layer 18, a thickness of the base layer 18 is between about 10 nanometers and about 2.5 micrometers. In one embodiment of the base layer 18, the base layer 18 includes N-type semiconductor material. In an additional embodiment of the base layer 18, the base layer 18 includes P-type semiconductor material. In one embodiment of the base layer 18, the base layer 18 includes doped semiconductor material. In one embodiment of the doped semiconductor material of the base layer 18, a carrier concentration of the doped semiconductor material is between about $1\times10^{16}$ carriers per cubic centimeter and about $1\times10^{18}$ carriers per cubic centimeter.

In one embodiment of the first emitter layer 20, the first emitter layer 20 includes SiC. In an alternate embodiment of the first emitter layer 20, the first emitter layer 20 includes Si, GaN, GaAs, diamond, the like, or any combination thereof. In one embodiment of the first emitter layer 20, a thickness of the first emitter layer 20 is between about 1 micrometer and about 3 micrometers. In one embodiment of the first emitter layer 20, the first emitter layer 20 includes N-type semiconductor material. In an additional embodiment of the first emitter layer 20, the first emitter layer 20 includes P-type semiconductor material. In one embodiment of the first emitter layer 20, the first emitter layer 20 includes doped semiconductor material. In one embodiment of the doped semiconductor material of the first emitter layer 20, a carrier concentration of the doped semiconductor material is between about $1\times10^{18}$ carriers per cubic centimeter and about $1\times10^{20}$ carriers per cubic centimeter.

In one embodiment of the BJT 10, the BJT 10 is a vertical BJT as illustrated in FIG. 1. In an alternate embodiment of the BJT 10, the BJT 10 is a lateral BJT. In other embodiments of the BJT 10, the BJT 10 may be of any configuration. In one embodiment of the BJT 10, the BJT 10 is part of a larger junction-based device, such as a thyristor. The thyristor may include an anode gate thyristor (AGT), a Si controlled rectifier (SCR), an asymmetrical SCR, a bidirectional control thyristor (BCT), a breakover diode (BOD), a gate turn-off thyristor (GTO), MOS controlled thyristor, a distributed buffer—GTO, an integrated gate commutated thyristor (IGCT), a light activated SCR (LASCR), a light activated semiconducting switch (LASS), a base resistance controlled thyristor (BRT), a reverse conducting thyristor (RCT), a programmable unijunction transistor (PUT), a triode for alternating current (TRIAC), or the like.

Figure 2:
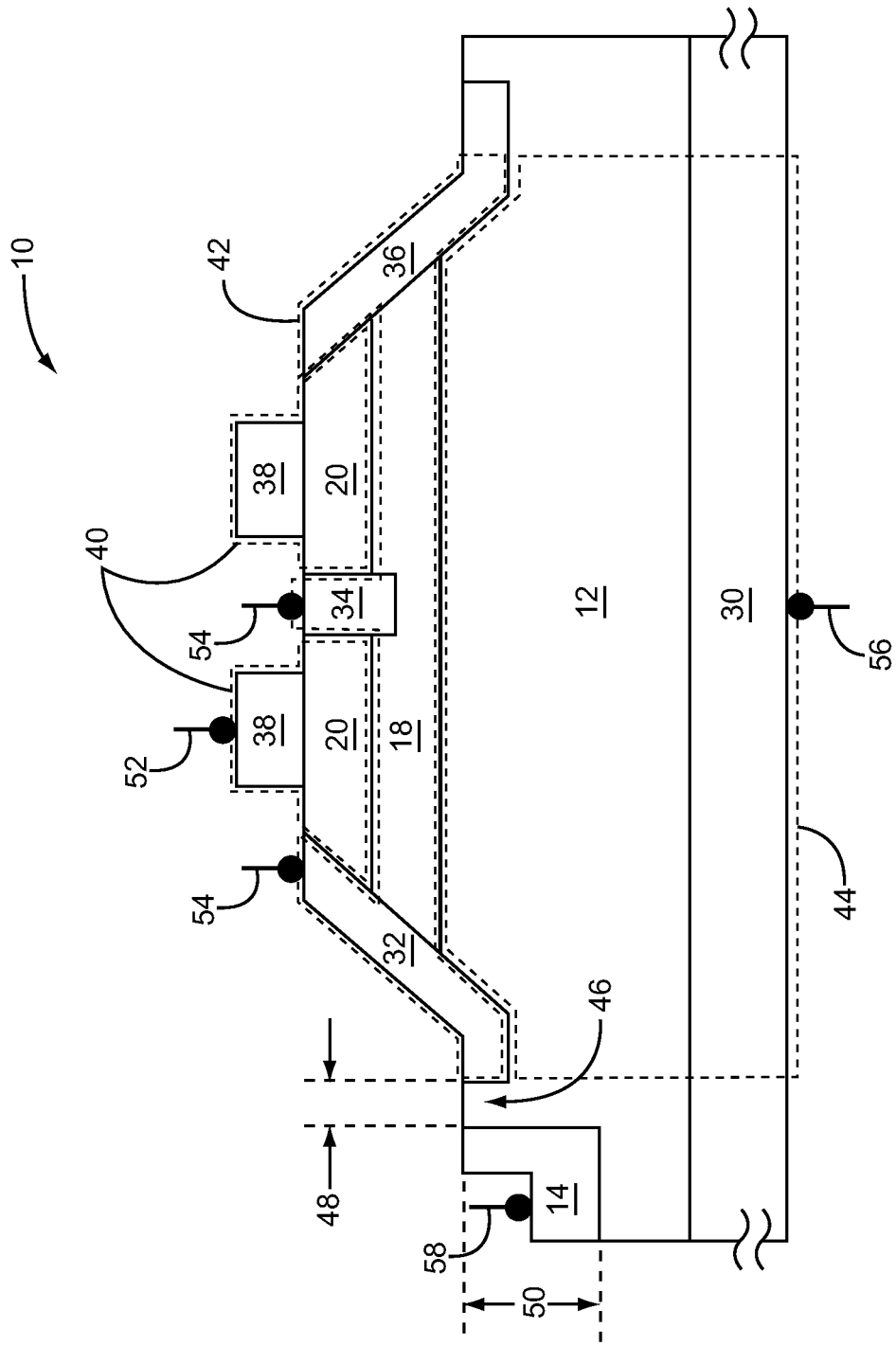
FIG. 2 illustrates a cross section of the BJT according to an alternate embodiment of the BJT.

FIG. 2 illustrates a cross section of the BJT 10 according to an alternate embodiment of the BJT 10. The BJT 10 illustrated in FIG. 2 is similar to the BJT 10 illustrated in FIG. 1, except the BJT 10 illustrated in FIG. 2 further includes a substrate 30, first supplemental base material 32, second supplemental base material 34, third supplemental base material 36, and a second emitter layer 38. The collector layer 12 is on the substrate 30 and the second emitter layer 38 is on the first emitter layer 20. The first supplemental base material 32 traverses the first emitter layer 20 and the base layer 18 into the collector layer 12. The second supplemental base material 34 traverses the first emitter layer 20 into the base layer 18. The third supplemental base material 36 traverses the first emitter layer 20 and the base layer 18 into the collector layer 12.

The BJT 10 includes an emitter 40, a base 42, and a collector 44. The emitter 40 includes at least a portion of the first emitter layer 20 and at least a portion of the second emitter layer 38. The base 42 includes at least a portion of the base layer 18, at least a portion of the first supplemental base material 32, at least a portion of the second supplemental base material 34, and at least a portion of the third supplemental base material 36. The collector 44 includes at least a portion of the collector layer 12 and at least a portion of the substrate 30. In one embodiment of the BJT 10, the first P-N junction 22 (FIG. 1) partially shields the collector 44 from the base 42, thereby reducing reverse transfer capacitance of the BJT 10 between the collector 44 and the base 42. Further, a physical isolation region 46 in the collector layer 12 physically isolates the recess region 14 from the base 42. The physical isolation region 46 has an isolation region distance 48 between the recess region 14 and the base 42. Additionally, the recess region 14 has a recess region thickness 50.

In a first embodiment of the recess region thickness 50, the recess region thickness 50 is between about 0.2 micrometers and about 1 micrometer. In a second embodiment of the recess region thickness 50, the recess region thickness 50 is between about 0.2 micrometers and about 0.5 micrometers. In a third embodiment of the recess region thickness 50, the recess region thickness 50 is between about 0.5 micrometers and about 1 micrometer. In a fourth embodiment of the recess region thickness 50, the recess region thickness 50 is between about 0.4 micrometers and about 0.7 micrometers. In a fifth embodiment of the recess region thickness 50, the recess region thickness 50 is less than about 0.2 micrometers. In a sixth embodiment of the recess region thickness 50, the recess region thickness 50 is between about 1 micrometer and about 5 micrometers.

In a first embodiment of the isolation region distance 48, the isolation region distance 48 is between about 0.1 micrometers and about 10 micrometers. In a second embodiment of the isolation region distance 48, the isolation region distance 48 is between about 0.1 micrometers and about 0.3 micrometers. In a third embodiment of the isolation region distance 48, the isolation region distance 48 is between about 0.1 micrometers and about 1 micrometer. In a fourth embodiment of the isolation region distance 48, the isolation region distance 48 is between about 0.5 micrometers and about 1 micrometer. In a fifth embodiment of the isolation region distance 48, the isolation region distance 48 is between about 0.5 micrometers and about 2 micrometers. In a sixth embodiment of the isolation region distance 48, the isolation region distance 48 is between about 1 micrometer and about 5 micrometers. In a seventh embodiment of the isolation region distance 48, the isolation region distance 48 is between about 3 micrometers and about 10 micrometers. In an eighth embodiment of the isolation region distance 48, the isolation region distance 48 is between about 0.8 micrometers and about 3 micrometers.

An electrical connection is made to the emitter 40 via at least one emitter electrical interconnect 52, which may be connected to the second emitter layer 38, as shown. An electrical connection is made to the base 42 via at least one base electrical interconnect 54, which may be connected to the first supplemental base material 32 and the second supplemental base material 34, as shown. An electrical connection is made to the collector 44 via a collector electrical interconnect 56, which may be connected to the substrate 30, as shown. An electrical connection is made to the recess region 14 via a recess region electrical interconnect 58, as shown. As such, since the first P-N junction 22 (FIG. 1) provides a body diode of the body 28 (FIG. 1), the BJT 10 is body-contacted.

In an alternate embodiment of the BJT 10, any or all of the substrate 30, the first supplemental base material 32, the second supplemental base material 34, the third supplemental base material 36, the second emitter layer 38, the physical isolation region 46, the emitter electrical interconnect 52, the base electrical interconnect 54, the collector electrical interconnect 56, and the recess region electrical interconnect 58 are omitted. In one embodiment of the BJT 10, the recess region 14 is coupled to ground via the recess region electrical interconnect 58. Further, the recess region 14 may be directly coupled to ground via the recess region electrical interconnect 58.

In one embodiment of the substrate 30, the substrate 30 includes SiC. In an alternate embodiment of the substrate 30, the substrate 30 includes Si, GaN, GaAs, diamond, the like, or any combination thereof. In one embodiment of the substrate 30, a thickness of the substrate 30 is between about 50 micrometers and about 300 micrometers. In one embodiment of the substrate 30, the substrate 30 includes N-type semiconductor material. In an additional embodiment of the substrate 30, the substrate 30 includes P-type semiconductor material. In one embodiment of the substrate 30, the substrate 30 includes doped semiconductor material. In one embodiment of the doped semiconductor material of the substrate 30, a carrier concentration of the doped semiconductor material is between about $1\times10^{18}$ carriersper cubic centimeter and about $1\times10^{20}$ carriers per cubic centimeter.

In one embodiment of the first supplemental base material 32, the first supplemental base material 32 includes SiC. In an alternate embodiment of the first supplemental base material 32, the first supplemental base material 32 includes Si, GaN, GaAs, diamond, the like, or any combination thereof. In one embodiment of the first supplemental base material 32, a thickness of the first supplemental base material 32 is between about 0.1 micrometers and about 2 micrometers. In one embodiment of the first supplemental base material 32, the first supplemental base material 32 includes N-type semiconductor material. In an additional embodiment of the first supplemental base material 32, the first supplemental base material 32 includes P-type semiconductor material. In one embodiment of the first supplemental base material 32, the first supplemental base material 32 includes doped semiconductor material. In one embodiment of the doped semiconductor material of the first supplemental base material 32, a carrier concentration of the doped semiconductor material is between about $1 \times 10^{16}$ carriersper cubic centimeter and about $1 \times 10^{20}$ carriers per cubic centimeter.

In one embodiment of the second supplemental base material 34, the second supplemental base material 34 includes SiC. In an alternate embodiment of the second supplemental base material 34, the second supplemental base material 34 includes Si, GaN, GaAs, diamond, the like, or any combination thereof. In one embodiment of the second supplemental base material 34, a thickness of the second supplemental base material 34 is between about 0.1 micrometers and about 2 micrometers. In one embodiment of the second supplemental base material 34, the second supplemental base material 34 includes N-type semiconductor material. In an additional embodiment of the second supplemental base material 34, the second supplemental base material 34 includes P-type semiconductor material. In one embodiment of the second supplemental base material 34, the second supplemental base material 34 includes doped semiconductor material. In one embodiment of the doped semiconductor material of the second supplemental base material 34, a carrier concentration of the doped semiconductor material is between about $1 \times 10^{16}$ carriers per cubic centimeter and about $1 \times 10^{20}$ carriers per cubic centimeter. In an alternate embodiment of the second supplemental base material 34, the second supplemental base material 34 includes moderately-doped semiconductor material.

In one embodiment of the third supplemental base material 36, the third supplemental base material 36 includes SiC. In an alternate embodiment of the third supplemental base material 36, the third supplemental base material 36 includes Si, GaN, GaAs, diamond, the like, or any combination thereof. In one embodiment of the third supplemental base material 36, a thickness of the third supplemental base material 36 is between about 0.1 micrometers and about 2 micrometers. In one embodiment of the third supplemental base material 36, the third supplemental base material 36 includes N-type semiconductor material. In an additional embodiment of the third supplemental base material 36, the third supplemental base material 36 includes P-type semiconductor material. In one embodiment of the third supplemental base material 36, the third supplemental base material 36 includes doped semiconductor material. In one embodiment of the doped semiconductor material of the third supplemental base material 36, a carrier concentration of the doped semiconductor material is between about $1 \times 10^{16}$ carriers per cubic centimeter and about $1 \times 10^{20}$ carriers per cubic centimeter.

In one embodiment of the second emitter layer 38, the second emitter layer 38 includes SiC. In an alternate embodiment of the second emitter layer 38, the second emitter layer 38 includes Si, GaN, GaAs, diamond, the like, or any combination thereof. In one embodiment of the second emitter layer 38, a thickness of the second emitter layer 38 is between about 0.5 micrometers and about 5 micrometers. In one embodiment of the second emitter layer 38, the second emitter layer 38 includes N-type semiconductor material. In an additional embodiment of the second emitter layer 38, the second emitter layer 38 includes P-type semiconductor material. In one embodiment of the second emitter layer 38, the second emitter layer 38 includes doped semiconductor material. In one embodiment of the doped semiconductor material of the second emitter layer 38, a carrier concentration of the doped semiconductor material is between about $XX1 \times 10^{17}$ carriers per cubic centimeter and about $1 \times 10^{20}$ carriers per cubic centimeter.

In an exemplary embodiment of the BJT 10, the substrate 30 includes heavily-doped N-type SiC, the collector layer 12 includes N-type SiC, the recess region 14 includes heavily-doped P-type SiC, the first supplemental base material 32 includes heavily-doped P-type SiC, the base layer 18 includes heavily-doped P-type SiC, the second supplemental base material 34 includes heavily-doped P-type SiC, the third supplemental base material 36 includes heavily-doped P-type SiC, the first emitter layer 20 includes N-type SiC, and the second emitter layer 38 includes heavily-doped N-type SiC.

Figure 3:
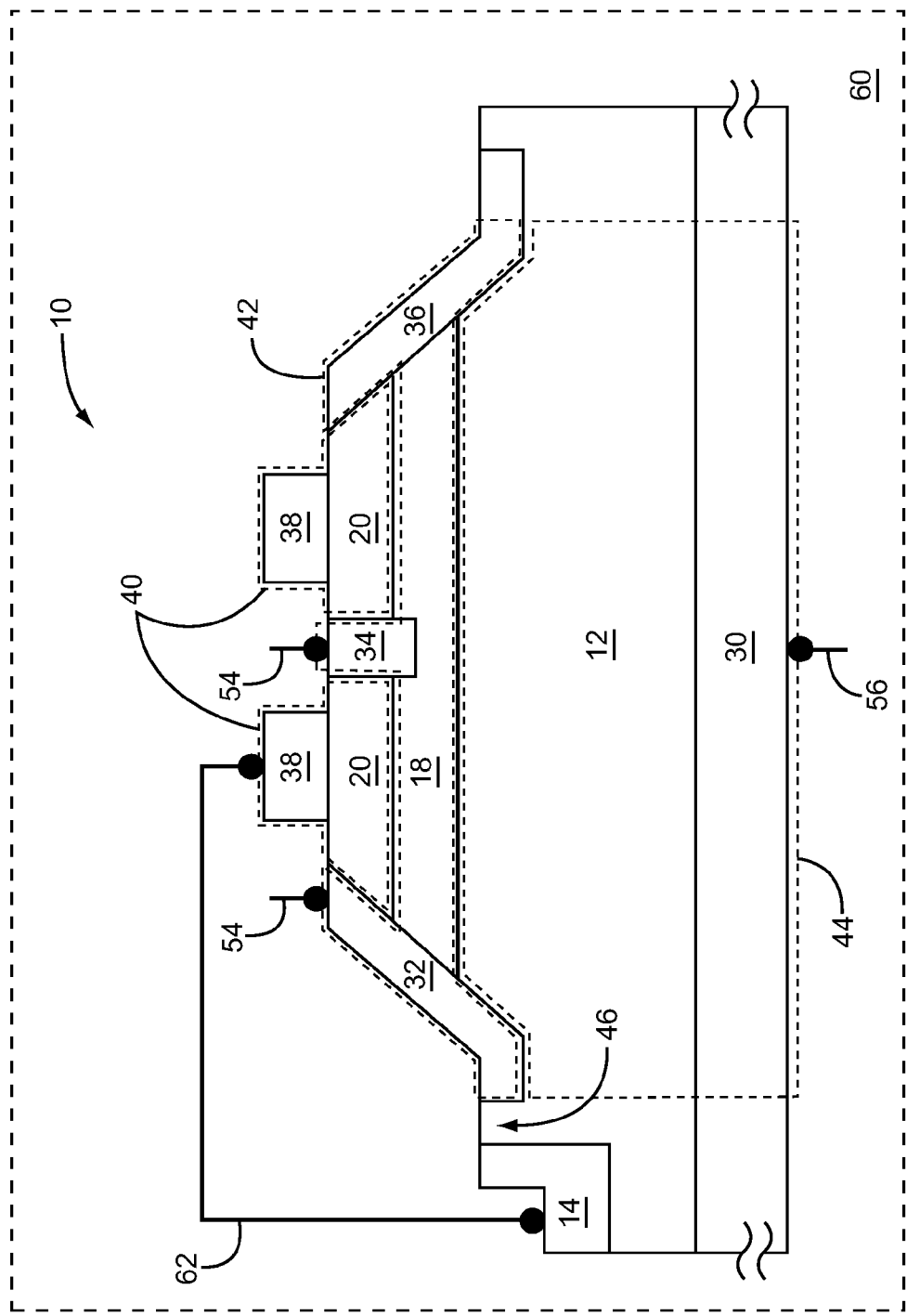
FIG. 3 illustrates a circuit, which includes the BJT and an electrical interconnect according to one embodiment of the present disclosure.

FIG. 3 illustrates a circuit 60, which includes the BJT 10 and an electrical interconnect 62 according to one embodiment of the present disclosure. The BJT 10 illustrated in FIG. 3 is similar to the BJT 10 illustrated in FIG. 2, except the emitter electrical interconnect 52 and the recess region electrical interconnect 58 are omitted. The electrical interconnect 62 is coupled between the recess region 14 and the emitter 40. In one embodiment of the BJT 10, the electrical interconnect 62 is directly coupled between the recess region 14 and the emitter 40. As such, the recess region 14 and the emitter 40 may be coupled to ground. Further, the recess region 14 and the emitter 40 may be directly coupled to ground.

Figure 4:
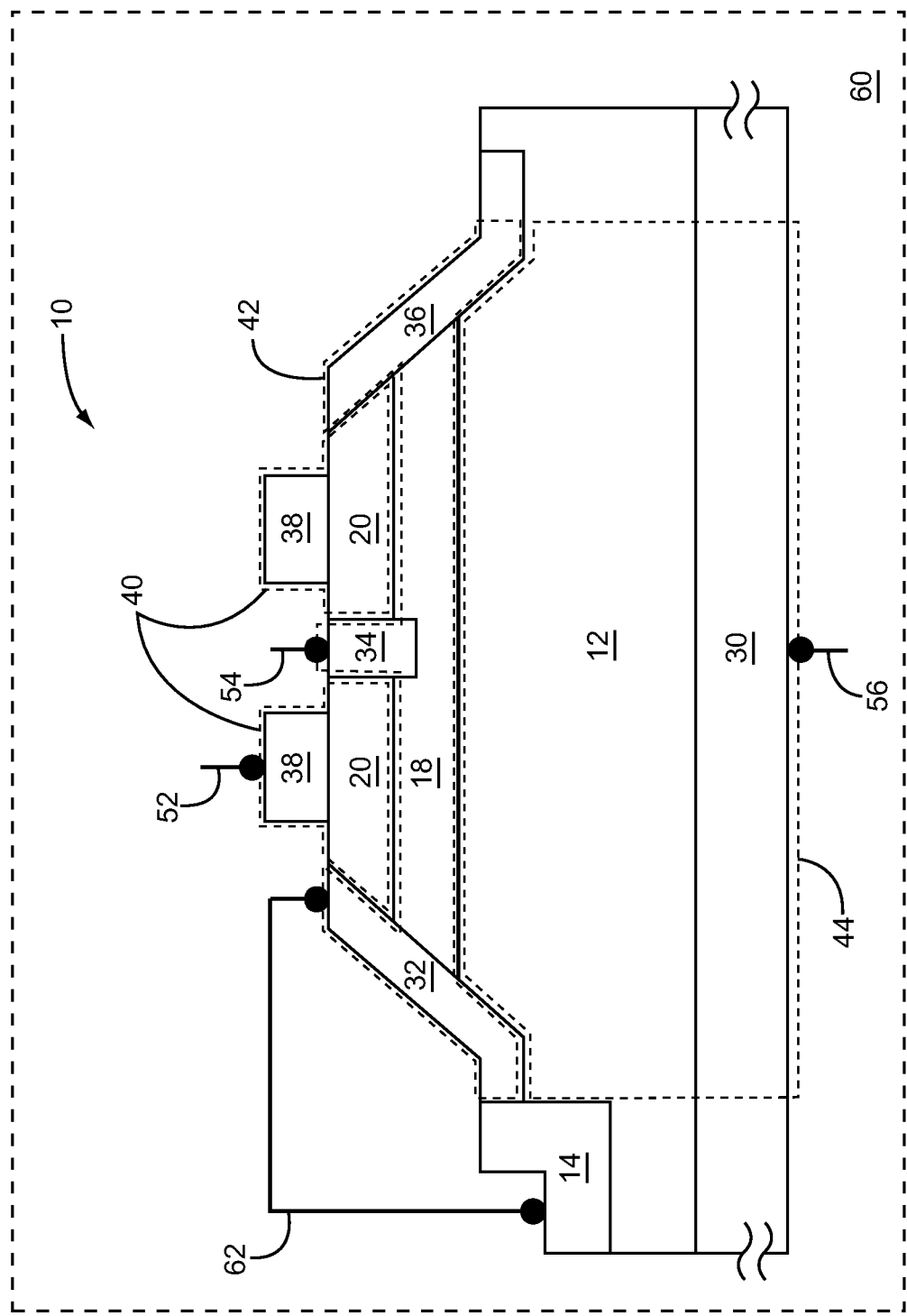
FIG. 4 illustrates the circuit, which includes the BJT and the electrical interconnect according to an alternate embodiment of the circuit.

FIG. 4 illustrates the circuit 60, which includes the BJT 10 and the electrical interconnect 62 according to an alternate embodiment of the circuit 60. The circuit 60 illustrated in FIG. 4 is similar to the circuit 60 illustrated in FIG. 3, except in the circuit 60 illustrated in FIG. 4, the electrical interconnect 62 is coupled between the recess region 14 and the base 42 instead of being coupled between the recess region 14 and the emitter 40. Further, the physical isolation region 46 (FIG. 3) is eliminated, such that the recess region 14 is directly adjacent to the base 42. In this regard, elimination of the physical isolation region 46 (FIG. 3) may result in an electrical connection between the recess region 14 and the base 42 within the BJT 10. As such, the first supplemental base material 32 is between the base layer 18 and the recess region 14. In one embodiment of the BJT 10, the electrical interconnect 62 is directly coupled between the recess region 14 and the base 42.

Figure 5:
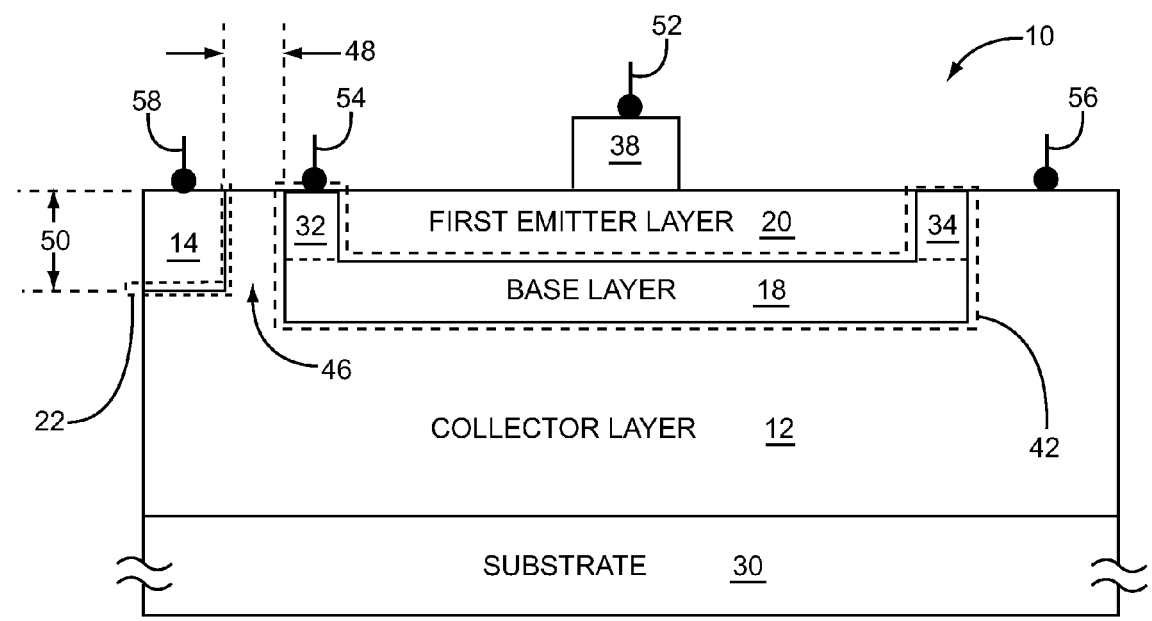
FIG. 5 illustrates a cross section of the BJT according to another embodiment of the BJT.

FIG. 5 illustrates a cross section of the BJT 10 according to another embodiment of the BJT 10. The BJT 10 illustrated in FIG. 5 is similar to the BJT 10 illustrated in FIG. 2, except the BJT 10 illustrated in FIG. 2 is a vertical BJT, whereas the BJT 10 illustrated in FIG. 5 is a lateral, or horizontal, BJT. The BJT 10 includes the substrate 30, the collector layer 12 on the substrate 30, the recess region 14 at least partially embedded in the collector layer 12, the base layer 18 on the collector layer 12, the first emitter layer 20 on the base layer 18, and the second emitter layer 38 on the first emitter layer 20. Further, the BJT 10 includes the base 42, which includes at least a portion of the base layer 18, at least a portion of the first supplemental base material 32, and at least a portion of the second supplemental base material 34. The first supplemental base material 32 is on the base layer 18 and the second supplemental base material 34 is on the base layer 18. The physical isolation region 46 in the collector layer 12 physically isolates the recess region 14 from the base 42. The physical isolation region 46 has the isolation region distance 48 between the recess region 14 and the base 42. Additionally, the recess region 14 has the recess region thickness 50.

The recess region 14 and the base layer 18 are the first type of semiconductor material. The collector layer 12 and the first emitter layer 20 are the second type of semiconductor material, which is opposite from the first type of semiconductor material. By embedding the recess region 14 in the collector layer 12, the recess region 14 and the collector layer 12 form the first P-N junction 22, which may provide a point of avalanche for the BJT 10. The collector layer 12 and the base layer 18 form the second P-N junction 24 (FIG. 1). By separating the point of avalanche from the second P-N junction 24 (FIG. 1), the BJT 10 may avalanche robustly, thereby reducing the likelihood of avalanche induced failures. In one embodiment of the BJT 10, the base 42 is at least partially embedded in the collector layer 12, such that the physical isolation region 46 in the collector layer 12 physically isolates the recess region 14 from the base 42.

At least one emitter electrical interconnect 52 may be connected to the second emitter layer 38, as shown. At least one base electrical interconnect 54 may be connected to the first supplemental base material 32, as shown. At least one collector electrical interconnect 56 may be connected to the collector layer 12, as shown. At least one recess region electrical interconnect 58 may be connected to the recess region 14, as shown. In alternate embodiments of the BJT 10, any or all of the substrate 30, the first supplemental base material 32, the second supplemental base material 34, the second emitter layer 38, the emitter electrical interconnect 52, the base electrical interconnect 54, the collector electrical interconnect 56, and the recess region electrical interconnect 58 are omitted.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. A bipolar junction transistor comprising:
   a collector layer;
   a recess region embedded in the collector layer, such that the recess region is a first type of semiconductor material and is below a base-collector plane;
   a base layer on the collector layer, such that the base layer is the first type of semiconductor material and the base-collector plane is between the base layer and the collector layer;
   a first emitter layer on the base layer;
   a collector, which comprises at least a portion of the collector layer;
   a base, which comprises at least a portion of the base layer; and
   an emitter, which comprises at least a portion of the first emitter layer, wherein the recess region is directly adjacent to the base.

2. The bipolar junction transistor of claim 1 wherein the collector layer comprises silicon carbide, the recess region comprises silicon carbide, and the base layer comprises silicon carbide.

3. The bipolar junction transistor of claim 2 wherein the first type of semiconductor material is P-type semiconductor material.

4. The bipolar junction transistor of claim 3 wherein the collector layer is a second type of semiconductor material, which is N-type semiconductor material.

5. The bipolar junction transistor of claim 2 wherein the first emitter layer comprises silicon carbide.

6. The bipolar junction transistor of claim 1 wherein the recess region and the collector layer form a body diode, such that the bipolar junction transistor is body-contacted.

7. A bipolar junction transistor comprising:
   a collector layer;
   a recess region embedded in the collector layer, such that the recess region is a first type of semiconductor material and is below a base-collector plane;
   a base layer on the collector layer, such that the base layer is the first type of semiconductor material and the base-collector plane is between the base layer and the collector layer;
   a first emitter layer on the base layer; and
   a second emitter layer on the first emitter layer.

8. The bipolar junction transistor of claim 1 wherein the recess region and the collector layer form a first P-N junction, the collector layer and the base layer form a second P-N junction, and the base layer and the first emitter layer form a third P-N junction, such that the first P-N junction is deeper in the bipolar junction transistor than the second P-N junction and the third P-N junction.

9. The bipolar junction transistor of claim 1 wherein the recess region and the collector layer form a first P-N junction, which partially shields the collector from the base.

10. The bipolar junction transistor of claim 1 wherein the recess region is physically isolated from the base.

11. The bipolar junction transistor of claim 1 wherein the base further comprises supplemental base material between the base layer and the recess region.

12. The bipolar junction transistor of claim 7 wherein the recess region and the collector layer form a first P-N junction, which is adapted to provide a point of avalanche for the bipolar junction transistor.

13. The bipolar junction transistor of claim 7 further comprising an emitter, which comprises at least a portion of the first emitter layer and at least a portion of the second emitter layer.

14. The bipolar junction transistor of claim 7 wherein:
   the recess region and the collector layer form a first P-N junction; and
   the base layer and the collector layer form a second P-N junction, wherein,
   during an avalanche event of the bipolar junction transistor, the bipolar junction is configured such that at least a portion of the avalanche event occurs in proximity to the first P-N junction instead of in proximity to the second P-N junction.

15. The bipolar junction transistor of claim 14 wherein the bipolar junction transistor is a silicon carbide bipolar junction transistor.

16. The bipolar junction transistor of claim 7 further comprising a substrate, such that the collector layer is on the substrate.

17. The bipolar junction transistor of claim 16 further comprising a collector, which comprises at least a portion of the collector layer and at least a portion of the substrate.

18. A circuit comprising:
a bipolar junction transistor comprising:
   a collector comprising at least a portion of a collector layer;
   a recess region embedded in the collector layer, such that the recess region is a first type of semiconductor material and is below a base-collector plane;
   a base comprising at least a portion of a base layer on the collector layer, such that the base layer is the first type of semiconductor material and the base-collector plane is between the base layer and the collector layer;
   an emitter comprising at least a portion of a first emitter layer on the base layer; and
an electrical interconnect coupled between the recess region and one of the base and the emitter.

19. The circuit of claim 18 wherein the collector layer comprises silicon carbide, the recess region comprises silicon carbide, and the base layer comprises silicon carbide.

20. The circuit of claim 19 wherein the first type of semiconductor material is P-type semiconductor material.

21. The circuit of claim 18 wherein the electrical interconnect is coupled between the recess region and the base.

22. The circuit of claim 21 wherein the recess region is directly adjacent to the base.

23. The circuit of claim 21 wherein the electrical interconnect is directly coupled between the recess region and the base.

24. The circuit of claim 18 wherein the electrical interconnect is coupled between the recess region and the emitter.

25. The circuit of claim 24 wherein the recess region is physically isolated from the base.

26. The circuit of claim 24 wherein the electrical interconnect is directly coupled between the recess region and the emitter.

27. The circuit of claim 18 wherein:
the recess region and the collector layer form a first P-N junction; and
the base layer and the collector layer form a second P-N junction, wherein,
during an avalanche event of the bipolar junction transistor, the circuit is configured such that at least a portion of the avalanche event occurs in proximity to the first P-N junction instead of in proximity to the second P-N junction.

28. The circuit of claim 27 wherein the bipolar junction transistor is a silicon carbide bipolar junction transistor.

29. A bipolar junction transistor comprising:
a collector layer;
a recess region at least partially embedded in the collector layer, such that the recess region is a first type of semiconductor material; and
a base at least partially embedded in the collector layer, such that the base is the first type of semiconductor material and a physical isolation region in the collector layer physically isolates the recess region from the base.

30. The bipolar junction transistor of claim 29 wherein the collector layer comprises silicon carbide, the recess region comprises silicon carbide, and the base comprises silicon carbide.

31. The bipolar junction transistor of claim 29 wherein the collector layer is a second type of semiconductor material, which is opposite from the first type of semiconductor material.

32. The bipolar junction transistor of claim 29 wherein the recess region and the collector layer form a first P-N junction, which is adapted to provide a point of avalanche for the bipolar junction transistor.

* * * * *